(12) United States Patent
Kurihara et al.

(10) Patent No.: US 7,859,175 B2
(45) Date of Patent: Dec. 28, 2010

(54) ILLUMINATING DEVICE, DISPLAY DEVICE AND OPTICAL FILM

(75) Inventors: Makoto Kurihara, Chiba (JP); Takafumi Morihara, Chiba (JP)

(73) Assignee: Seiko Instruments Inc. (JP)

( * ) Notice: Subject to any disclaimer, the term of this patent is extended or adjusted under 35 U.S.C. 154(b) by 236 days.

(21) Appl. No.: 12/152,782

(22) Filed: May 16, 2008

(65) Prior Publication Data

US 2008/0284316 A1 Nov. 20, 2008

(30) Foreign Application Priority Data

May 18, 2007 (JP) ............................. 2007-132876
Oct. 24, 2007 (JP) ............................. 2007-276592

(51) Int. Cl.
*H01J 5/16* (2006.01)
(52) U.S. Cl. ..................... 313/112; 313/110; 313/111
(58) Field of Classification Search .......... 313/110–113
See application file for complete search history.

(56) References Cited

U.S. PATENT DOCUMENTS 6,280,890 B1 * 8/2001 Sawamura et al. ............. 430/7
6,637,905 B1 * 10/2003 Ng et al. ...................... 362/601
6,646,699 B2 * 11/2003 Utsumi et al. ................ 349/104
2004/0061810 A1 * 4/2004 Lowery et al. ................. 349/62

FOREIGN PATENT DOCUMENTS

JP 2004119375 A * 4/2004

* cited by examiner

*Primary Examiner*—Vip Patel
(74) *Attorney, Agent, or Firm*—Adams & Wilks

(57) ABSTRACT

A display device has a light source that radiates light from a light-emitting portion. A light guide body receives an incident light from the light-emitting portion of the light source and emits light. A display element is illuminated by light emitted from the light guide body and has a color filter having a coloring layer of RGB. A filter layer reflects components of light having a wavelength in a preselected region of 570 nm to 590 nm among the light radiated from the light source and emitted from the light guide body. A phosphor is excited by the components of light in the preselected region reflected by the filter layer and emits red light that passes through the filter layer and through the color filter of the display element.

20 Claims, 5 Drawing Sheets

ILLUMINATING DEVICE, DISPLAY DEVICE AND OPTICAL FILM

BACKGROUND OF THE INVENTION

1. Field of the Invention

The present invention relates to an illuminating device for illuminating display elements used in a portable information apparatus, a cellular phone, and the like, a display device having the illuminating device, and an optical film used in the illuminating device.

2. Description of the Related Art

In recent years, a liquid crystal display device, which obtains a high definition color image with small power consumption, is employed as a display device used in a cellular phone, a mobile computer, and the like. The liquid crystal display element requires an illuminating device because the liquid crystal display element is a non-selfluminescent display element that does not emit light. A superluminescent white LED is often used as a light source in the illuminating device.

In particular, in a cellular phone, a reflection-type liquid crystal display device that has a large and bright opening or a double-side visible type liquid crystal display device that is capable of displaying image information on both front and backsides thereof is used. In those display devices, a front light or a back light using a white LED as a light source has been used as an illuminating device. The white LED has a configuration in which a blue LED emitting blue light is covered with a resin in which a yellow phosphor is dispersed, and green light or yellow light emitted from the phosphor is mixed with original blue light to obtain white light by a complementary color relationship (see, for example, JP 10-107325 A). The liquid crystal display device selects a necessary color from light, which is emitted from the white LED, using color filters of red (R), green (G), and blue (B) provided in a liquid crystal panel and a switching function of the liquid crystal elements and displays the selected color.

Then, the following configuration is known, in which a phosphor that is excited with light in a region not passing through a liquid crystal panel and emits light having a wavelength passing through the liquid crystal panel is provided between the output plane of a light guide body and the display panel, whereby the use efficiency of light from alight source is enhanced (see, for example, JP 2006-338901 A).

Further, as a light source for general illumination, a cold cathode tube, an incandescent electric lamp, and the like are known. For example, when a current flows through a cold cathode tube, electrons jump from a fluorescent tube filament, and bump into mercury in gaseous form sealed inside, whereby UV-rays are emitted. The inside of the fluorescent glass tube is coated with a phosphor, and the phosphor emits light when UV-rays strike the phosphor, and visible light is released outside of the fluorescent tube to be used for illumination. That is, spectrum of light to be output is determined depending upon the characteristics and compounding of phosphors applied to the inside of the glass tube.

A wavelength distribution of the conventional white LED used in the illuminating device of the liquid crystal display device spreads broadly with peaks at 450 nm and 580 nm because light emitted by the white LED is white light of a mixed color obtained by mixing blue color light with yellow or green color light. On the other hand, peaks of wavelength selected by a color filter used in the liquid crystal display device or the like are 450 nm for blue, 530 nm for green, and 600 nm for red. In other words, among light from a white light source, the light having a wavelength of 480 nm to 510 nm and a wavelength 570 nm to 590 nm are absorbed by the color filter. Therefore, the use efficiency of light is low, and brightness is low. Further, according to the configuration described in JP 2006-338901 A, all light having the wavelengths to be absorbed by the liquid crystal panel does not necessarily strike the phosphor to be color-converted, with the result that the use efficiency cannot be enhanced to a desired degree. It is necessary to efficiently convert light having unnecessary wavelengths into light having a necessary wavelength.

On the other hand, for example, in the case where there is an object to be illuminated, a red component of which is desired to be emphasized, such as an apple, a green-based component is not necessary in illumination in a store and the like. A conventional light source for illumination does not have a function of eliminating only light having unnecessary wavelengths and emphasizing light having a necessary wavelength more. Therefore, it is not easy to eliminate only a green-based component and emphasize a red color more. For example, it may not be impossible to eliminate only a green-based component and emphasize a red color more, by using a color filter containing a pigment or the like cutting the periphery of a green-based component in a very high concentration, or using a plurality of light sources. However, there are problems of power consumption, heat generation, and a cost, and hence, the above method is unrealistic.

SUMMARY OF THE INVENTION

In order to solve the above common problem, an object of the present invention is to easily realize a configuration in which only light having an unnecessary wavelength is cut and light having a necessary wavelength may be obtained efficiently.

In view of the above problems, an illuminating device according to the present invention includes: a light source that radiates light from a light-emitting portion; a filter layer that selectively reflects light in a particular wavelength region among light from the light source; and a phosphor that is excited with the light in the particular wavelength region, which is reflected by the filter layer, to emit light, in which the light reflected by the filter layer is converted by the phosphor so as to pass through the filter layer. Thus, a light component in a particular wavelength region may be decreased from light of a light-emitting portion, and a light component having other wavelengths may be increased. More specifically, by appropriately selecting a filter layer and a phosphor, the color tone (light-emitting wavelength characteristics) of an illuminating device may be controlled.

Here, a wavelength control film, in which a phosphor layer containing a phosphor and a filter layer are formed on a base film, may be used. Alternatively, the phosphor layer and the filter layer may be formed separately. The phosphor layer may have a configuration in which a phosphor is dispersed in a transparent resin, or a configuration in which a phosphor is arranged therein. When the phosphor layer and the filter layer are provided separately, it is preferred that a light source be placed between the phosphor layer and the filter layer.

Further, in the case where a light-emitting portion of a light source emits first peak light having a peak in a first wavelength and second peak light having a peak in a second wavelength, light having a particular wavelength reflected by the filter layer becomes light in a wavelength region between the first peak light and the second peak light. With such a configuration, a light component having a wavelength of a valley of a peak wavelength of a light source may be shifted by conversion with a phosphor.

Further, in a display device having such an illuminating device and a display element provided on an output plane side of the illuminating device, light in a particular wavelength region to be absorbed by the display element is reflected by the filter layer, and the light reflected by the filter layer may be converted by the phosphor into light having a wavelength capable of passing through the display element.

Further, in a configuration in which the display element includes a color filter having a first colorant and a second colorant, the particular wavelength region reflected by the filter layer is set to be in a valley between the peak of a transmission wavelength region of the first colorant and the peak of the transmission wavelength region of the second colorant.

Further, a second filter layer reflecting a light component having a second particular wavelength different from the particular wavelength region is provided between the light-emitting portion of the light source and the display element, and a second phosphor that is excited with light having the second particular wavelength to emit light is provided between the second filter layer and the light-emitting portion. Further, the light-emitting portion of the illuminating device emits third peak light having a peak in a third wavelength, and a second particular wavelength region is provided between the second peak light and the third peak light.

Alternatively, the display element includes a color filter having a first colorant, a second colorant, and a third colorant, and includes a second filter layer that reflects light in a second particular wavelength region different from a particular wavelength region and a second phosphor that is excited with light in the second particular wavelength region to emit light, in which the particular wavelength region is present in a valley between the peak of the transmission wavelength region of the first colorant and the peak of the transmission wavelength region of the second colorant, and the second particular wavelength region is present in a valley between the peak of the transmission wavelength region of the second colorant and the peak of the transmission wavelength region of the third colorant. Here, the color filter has a coloring layer of RGB. The particular wavelength region is 570 nm to 590 nm and the second particular wavelength region is 480 nm to 500 nm. A green phosphor converting a light component in the second particular wavelength region into green light and a red phosphor converting a light component in the particular wavelength region and a light component in the second particular wavelength region into red light are used.

At this time, the light-emitting portion of the light source emits first peak light, second peak light, and third peak light having a peak in a third wavelength. The particular wavelength region is present between the wavelength of the first peak light and the wavelength of the second peak light. The second particular wavelength region is present between the wavelength of the second peak light and the wavelength of the third peak light.

Further, a filter layer that selectively reflects light in a particular wavelength region and a phosphor layer containing a phosphor that is excited with light in the particular wavelength region to emit light are formed into films to constitute an optical film. Light radiated from the phosphor layer side is transmitted through the filter layer by allowing a phosphor layer to convert light reflected by the filter layer into light having a different wavelength. Thus, light having a necessary wavelength may be emphasized with only light having an unnecessary wavelength being cut.

DETAILED DESCRIPTION OF THE PREFERRED EMBODIMENTS

Figure 1:
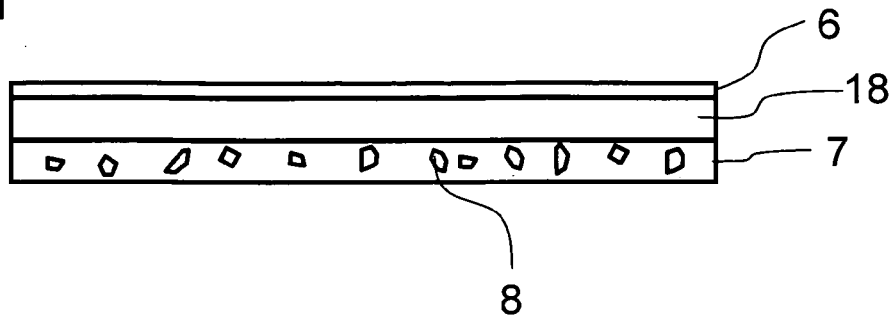
FIG. 1 is a cross-sectional view schematically showing a configuration of a wavelength control film according to the present invention.

An illuminating device of the present invention includes a light source radiating light from a light-emitting portion, a filter layer selectively reflecting light in a particular wavelength region among light from the light source, and a phosphor that is excited with light reflected by the filter layer to emit light. At this time, the emitted light of the phosphor contains a component passing through the filter layer. More specifically, the light reflected by the filter layer is converted into light having a different wavelength by the phosphor so as to pass through the filter layer. Thus, light in a particular wavelength region among light from the light source is reflected, and a light component in the particular wavelength region is converted into light having another wavelength to be emitted, whereby the light component in the particular wavelength region may be decreased from the light from the light source, and light components in other wavelength regions may be increased. Further, by using a phosphor emitting light in a wavelength region in a small amount contained in the light emitted from the light source, the color tone (light-emitting wavelength characteristics) of the illuminating device may be controlled easily. Thus, the illuminating device of the present invention may be used widely for conversion of a wavelength of the light from the light source, and the decrease in power consumption of a color light source and the enhancement of color reproduction may be promoted.

Further, in the case of using a light source emitting first peak light having a peak in a first wavelength and second peak light having a peak in a second wavelength from a light-emitting portion, a filter layer reflecting light in a wavelength region between the first peak light and the second peak light is placed in a path of light from the light source so that a phosphor converts light reflected by the reflection filter into light passing through the filter layer. This enables a light component in a wavelength of a valley of a peak wavelength of the light source to be converted by a phosphor to be output. At this time, the light component in a wavelength of the valley of the peak wavelength of the light source decreases and a peak becomes remarkable, which enhances a color purity. Further, if the phosphor is allowed to emit light in the vicinity of the second wavelength, the color in the vicinity of the second wavelength is compensated. Alternatively, if the phosphor is allowed to emit light in the vicinity of a wavelength that is different from the first wavelength and the second wavelength, a color component that is not provided in the light source may be added. Thus, according to the present invention, the control of a color tone and the control of color reproduction may be performed easily, and an illuminating device with very high color reproduction may be realized.

Further, in the case of illuminating a display element using such an illuminating device, a filter layer is provided between the light source of the illuminating device and the display element, light in a particular wavelength region to be absorbed by the display element is reflected by the filter layer, and the light in the particular wavelength region reflected by the filter layer is converted into light having a wavelength capable of passing through the display device in a phosphor layer. Thus, light that does not reach an observer by being absorbed by the display element is converted into light that reaches the observer by the phosphor layer, and hence the use efficiency of light is enhanced.

Further, in the case where the display element has a color filter, a wavelength component that cannot pass through the color filter among the wavelengths of light emitted by the illuminating device may be present. At this time, the wavelength component is converted by the phosphor into a wavelength component capable of passing through the color filter, whereby the amount of light passing through the color filter may be increased, and the brightness may be enhanced. Further, the control of color reproduction may be performed easily, and a display device with very high color reproduction may be realized.

Further, a second filter layer reflecting a light component in a second particular wavelength region different from the particular wavelength region may be provided between the light source of the illuminating device and the display element.

Then, if a second phosphor that is excited with light in the second particular wavelength region reflected by the second filter layer to emit light in a wavelength region passing through the first and second filter layers is provided between the second filter layer and the light source, the light in a plurality of particular wavelengths may be converted for use. At this time, the phosphor and the second phosphor may emit light in different wavelength regions, or the second phosphor may emit light in the same wavelength region as that of the phosphor. The filter layer and the phosphor used in the illuminating device and the display device may be formed on one base film. More specifically, an optical film is configured, which includes a filter layer selectively reflecting light in the particular wavelength region and a phosphor layer containing a phosphor that is excited with light of a component contained in the particular wavelength region to emit light passing through the filter layer. Then, the optical film is configured so that the phosphor layer faces the light source side and illuminating light is emitted from the filter layer. Thus, the phosphor layer converts the light reflected by the filter layer into light having a different wavelength and the converted light can pass through the filter layer. Hereinafter, the display device having the illuminating device according to the present invention, and the wavelength control film applicable to the illuminating device of the present invention are described specifically with reference to the drawings.

Embodiment 1

Figure 10:
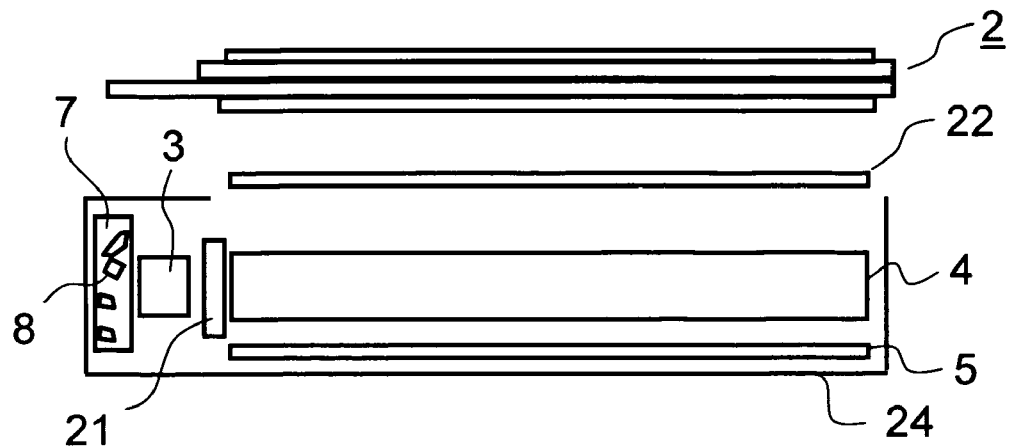
FIG. 10 is a schematic view showing a configuration of a cross-section of the display device according to the present invention.
Figure 11:
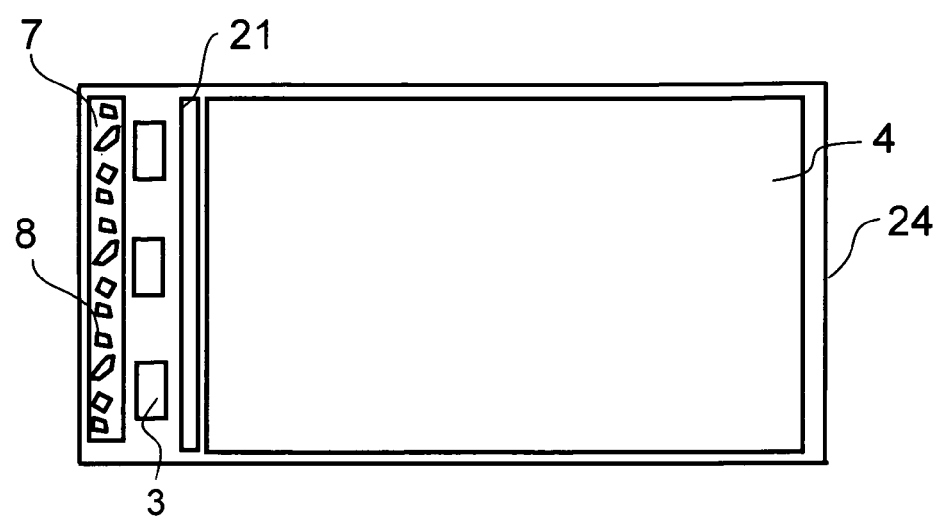
FIG. 11 is a top view schematically showing a configuration of the display device according to the present invention.

FIG. 10 shows a configuration of a cross-section of a display device of this embodiment, and FIG. 11 schematically shows a configuration viewed from above. In this embodiment, as a light source 3, an LED package of a three-wavelength light-emitting type is used, which has a configuration in which a resin mixed with a green phosphor and a red phosphor is potted to a blue LED. Light from the light source 3 is brought to be incident upon a light guide body 4 from an incident plane thereof. The incident plane is formed so as to face the light source 3. The light guide body 4 has a configuration of guiding light incident from the incident plane and outputting the light from an output plane. For example, the light guide body 4 may be produced by injection-molding a transparent resin agent such as polycarbonate, acryl, ZEONOA, or ARTON. Further, the incident plane may be subjected to fine prism treatment so that light is scattered inside the light guide body 4 efficiently. Further, in order to enhance an emission efficiency, the output plane of the light guide body 4 may be subjected to diffusion treatment or may be provided with a prism. The surface of the light guide body 4 on an opposite side of the reverse surface (i.e., the output plane) of the light guide body 4 is provided with a prism based on optical design so that light is output with good distribution. Further, a reflective plate 5 is placed on the reverse surface side of the light guide body 4. Light leaking outside from the reverse surface of the light guide body 4 is reflected by the reflective plate 5 and is brought to be incident upon the inside of the light guide body 4 again, whereby the use efficiency of light is enhanced. Here, as the reflective plate 5, a plate on which silver or aluminum is vapor-deposited, white PET, or the like may be used. Generally, a silver reflective plate is used for a small product and white PET is used for a large product in most cases. Light output from the light guide body 4 has its directivity controlled by an optical film 22 such as a diffusion sheet or a prism sheet, and radiated to a display element 2.

Figure 5:
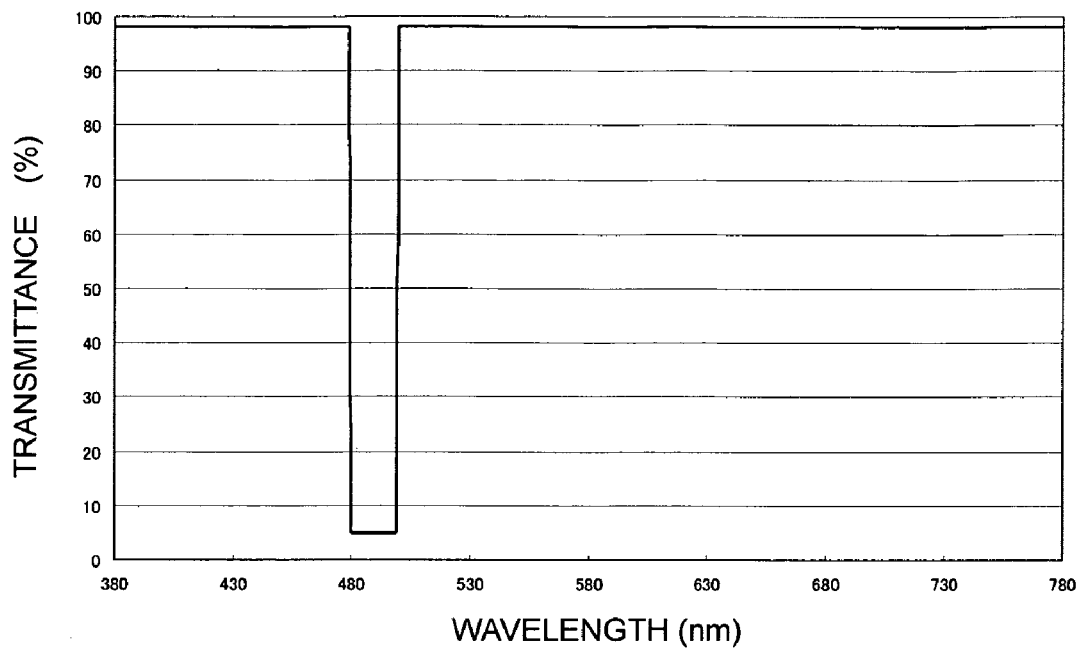
FIG. 5 is a diagram showing a relationship between a wavelength and a transmittance of a first filter layer.
Figure 6:
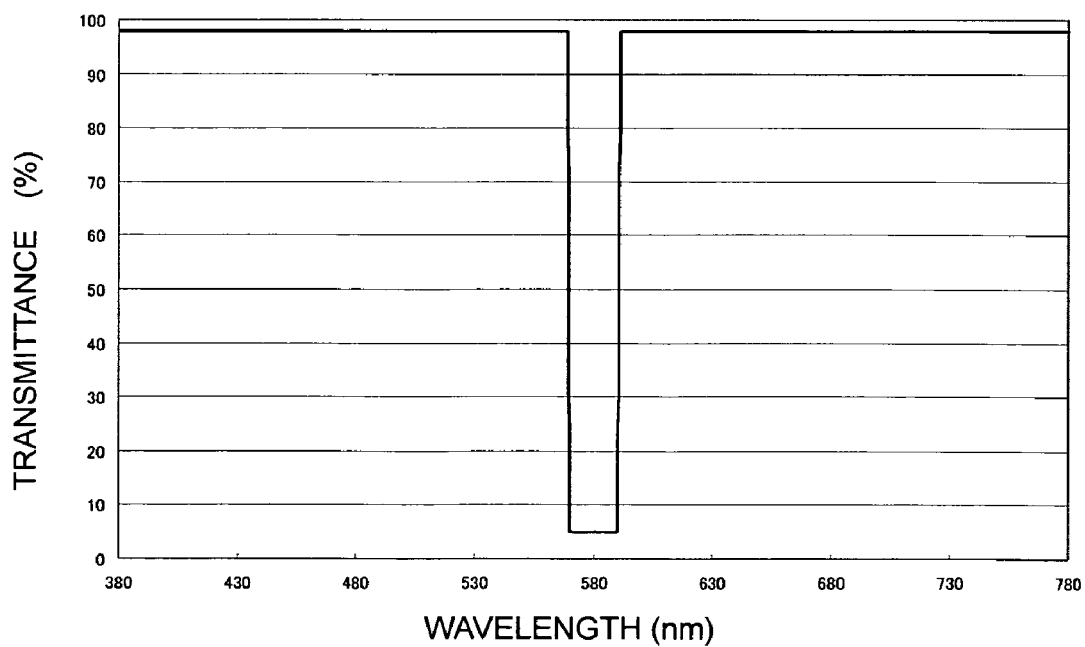
FIG. 6 is a diagram showing a relationship between a wavelength and a transmittance of a second filter layer.
Figure 12:
FIG. 12 is a cross-sectional view schematically showing a configuration of a wavelength selecting film according to the present invention.

Further, as shown in FIGS. 10 and 11, in this embodiment, a wavelength selecting film 21 is placed between the light source 3 and the light guide body 4. FIG. 12 shows a cross-sectional view of the wavelength selecting film 21. As shown in FIG. 12, a first filter layer 9 reflecting light having a particular wavelength and a second filter layer 10 are provided on a base film 18. Here, as the base film 18, a transparent resin such as PET, PES, or acryl, or a transparent glass plate may be used. As the first and second filter layers 9 and 10, a multi-layered film in which tens of thin films having different refractive indexes of $SiO_2$, $TiO_2$, or the like are laminated alternately may be used. Alternatively, a nanoparticle layer having a configuration in which nanoparticles of about 200 to 300 nm are printed onto the base film may be used. In this embodiment, the first filter layer 9 reflects only light having a wavelength of 570 nm to 590 nm. FIG. 6 shows a spectral transmittance of the first filter layer 9. On the other hand, the second filter layer 10 reflects only light having a wavelength of 480 nm to 500 nm. FIG. 5 shows a spectral transmittance of the second filter layer 10.

Further, a phosphor layer 7 is placed on an opposite side of the output plane of the light source 3. More specifically, the light source 3 is placed between the wavelength selecting film 21 and the phosphor layer 7. The phosphor layer 7 has a configuration in which a phosphor 8 is dispersed in a transparent resin such as silicon, acryl, or epoxy. Alternatively, a phosphor layer in which a phosphor is applied to a transparent base film may be used. In this embodiment, as the phosphor 8, a phosphor that is excited with blue to green light of 400 nm to 590 nm and emits red light is used. As the red phosphor, SrS, CaS, or $CaAlSiN_3$ with Eu added thereto as a rare-earth element, or silicate of 3,1,5 composition system may be illustrated.

As described above, the first filter layer 9 selectively reflects light having a wavelength of 570 nm to 590 nm, and the second filter layer 10 selectively reflects light having a wavelength of 480 nm to 500 nm. Thus, according to the configuration of this embodiment, the wavelength selecting film 21 reflects light having a wavelength of 480 nm to 500 nm and a wavelength of 570 nm to 590 nm among light from the light source 3. Among the reflected light, light striking the phosphor 8 in the phosphor layer 7 is converted into red light, and passes through the wavelength selecting film 21 (i.e., the first filter layer 9 and the second filter layer 10). Light that does not strike the phosphor 8 is reflected by the wavelength selecting film 21 again, and is not brought to be incident upon the light guide body 4. Thus, the reflection and color conversion are repeated, whereby most components having a wavelength of 480 nm to 500 nm and a wavelength of 570 nm to 590 nm are converted into red light finally. Thus, in the light output from the light guide body, components having a wavelength of 480 nm to 500 nm and 570 nm to 590 nm are hardly present, and a red component is emphasized.

If the wavelength selecting film 21 is placed between the light source 3 and the light guide body 4 as in the above configuration, the use area of the wavelength selecting film 21 may be minimized. In the case of using a multi-layered film in which tens of layers are laminated for the wavelength selecting film 21, it may be expected that a cost is decreased by suppressing the use amount. In the case of using a point light source as in this embodiment, the effect may be obtained if the wavelength selecting film (substantially, a filter layer) is provided in a portion upon which light is brought to be incident from the point light source. However, it is preferred to provide the wavelength selecting film (substantially, a filter layer) over the entire surface of the incident plane of the light guide body so as to maximize the use efficiency of light.

These components are covered with a frame 24 so as to prevent light leakage and to enhance strength. As the frame 24, a molding of white polycarbonate or the like, or a metal frame such as an aluminum plate may be used. More specifically, it is necessary to provide the inside surface of the frame 24, in particular, the surface close to the phosphor layer with a reflection function.

Figure 9:
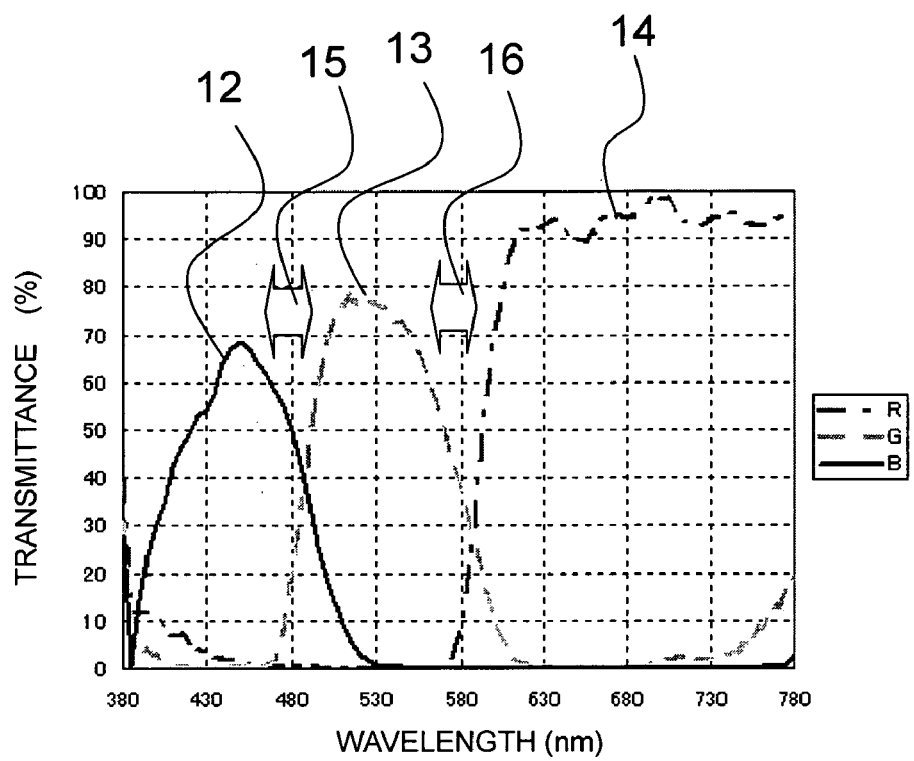
FIG. 9 is a diagram showing a relationship between a wavelength and a transmittance of a color filter of a display element.

Next, FIG. 9 shows characteristics of a color filter of the display element 2 used in this embodiment. The display element 2 includes a color filter of three colors: blue, green, and red. FIG. 9 illustrates blue color filter characteristics 12, green color filter characteristics 13, and red color filter characteristics 14. As is apparent from the figure, light having a wavelength of 480 nm to 500 nm and a wavelength of 570 nm to 590 nm is included in absorption regions (cut regions) 15, 16 by the color filter, and hence most of the light having such wavelengths is cut even if it reaches the display element. That is, it is understood that, by using the wavelength selecting film and the phosphor layer as in this embodiment, light originally having a wavelength in the cut region may be converted into light having an effective wavelength.

In this embodiment, although two filter layers 9 and 10 are provided, some effects can also be obtained even by using either one filter layer. Further, using a phosphor that is excited with light reflected by at least one filter layer and emits, for example, green light enables a green component as well as a red component to be added.

Further, in this embodiment, since the display element having the color filter of three colors is combined with the illuminating device, the wavelength selecting film 21 that reflects light in two wavelength regions corresponding to regions among three peaks is used. However, if a wavelength region of light reflected by the wavelength selecting film is selected appropriately in accordance with the color filter characteristics of the display element and the wavelength region of light emitted by the light source, the features of the present invention may be applied to a display device having any configuration.

The phosphor layer 7 may be formed on the wavelength selecting film 21. In this case, because the transmittance of the film may decrease and the use efficiency of light may decrease, it is preferred that the phosphor layer be present separately from the wavelength selecting film as in this embodiment.

Further, in the wavelength selecting film 21 of this embodiment, the first filter layer 9 and the second filter layer 10 are formed on both surfaces of the base film 18. The warpage of the wavelength selecting film may be prevented by laminating the first and second filter layers 9 and 10 on both surfaces of the base film 18. In the case where two filter layers are laminated on one surface of the base film, the film is likely to be warped, which makes it difficult to handle the film. Even if the base film tends to be curved, the curvature may be prevented by forming the filter layers on both surfaces of the base film. In this embodiment, although the first filter layer 9 cutting light having a wavelength of 570 nm to 590 nm is placed on one surface, and the second filter layer 10 cutting light having a wavelength of 480 nm to 500 nm is placed on the other surface, for example, filter layers cutting light having the same wavelengths may be placed on both surfaces.

Further, for example, if a pseudo white LED in which a yellow phosphor is potted to a blue LED is used as a light source, a red component that is not originally present may be added.

Further, even if a violet LED in which a red phosphor is potted to a blue LED is used as a light source, and a green phosphor is used for the phosphor layer 7, an illuminating device having very high luminance and a peak of RGB with a small half-width may be provided.

Although the case of using a point light source such as a three-wavelength LED as a light source has been described, a cold-cathode fluorescent lamp (CCFL; florescent tube) can also be used.

Embodiment 2

Figure 2:
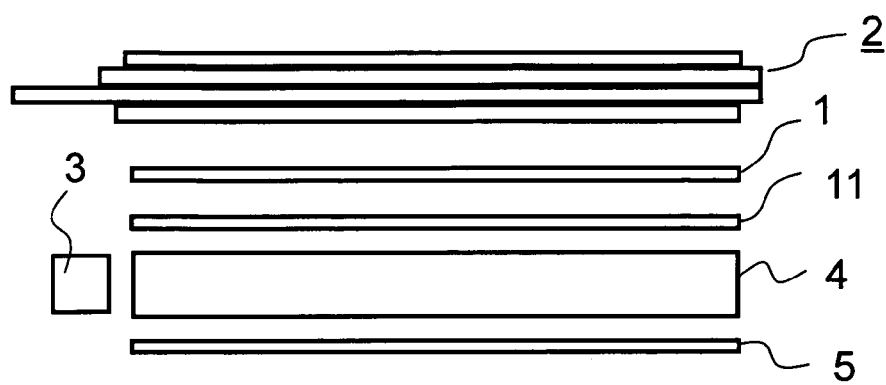
FIG. 2 is a schematic view showing a configuration of a cross-section of a display device according to the present invention.

In this embodiment, a display device using a wavelength control film in which a filter layer and a phosphor layer are formed on a base film is described. FIG. 2 is a cross-sectional view schematically showing a configuration of a display device of this embodiment. The same description and application examples as those in Embodiment 1 are omitted if necessary. The light guide body 4 has a configuration of guiding light incident from an incident plane and outputting the light from an output plane. Light from the light source 3 is brought to be incident upon the light guide body from the incident plane of the light guide body 4. As the light source 3, an LED package of a three-wavelength light-emitting type is used, which has a configuration in which a resin mixed with a green phosphor and a red phosphor is potted to a blue LED. Further, the reflective plate 5 is placed on the reverse surface side of the light guide body 4. Light leaking outside from the reverse surface of the light guide body 4 is reflected by the reflective plate 5 and is brought to be incident upon the inside of the light guide body again. Light output from the output plate of the light guide body 4 passes through the display element 2 after passing through a second wavelength control film 11 and a first wavelength control film 1, and a display is observed. A prism sheet or a diffusion sheet may be placed between the display element 2 and the first wavelength control film 1.

FIG. 1 schematically shows the wavelength control film used in this embodiment. The wavelength control film has a configuration in which the phosphor layer 7 containing the phosphor 8 and the filter layer 6 reflecting light in a particular wavelength region are respectively provided on the surfaces of the base film 18. More specifically, in the second wavelength control film 11, the phosphor dispersed in the phosphor layer is a green phosphor that is excited with blue light having a wavelength of 380 nm to 500 nm to emit green light. Embodiments of such a green phosphor include: a phosphor material made of II-group metal thiogallate and a rare-earth dopant; an oxide phosphor and a rare-earth dopant; Sr-SION and a rare-earth dopant; and a silicate phosphor of a 2,1,4 composition. Further, a second filter layer reflecting only light in a certain wavelength region is provided on an observer side of the green phosphor layer. FIG. 5 shows transmittance characteristics of the second filter layer. As shown in FIG. 5, the second filter layer in this embodiment is configured so as to mainly reflect light having a wavelength in a range of 480 nm to 500 nm.

According to such a configuration, among light incident upon the green phosphor layer of the second wavelength control film 11 through the light guide body from the light source 3 of a three-wavelength light-emitting type, blue light striking the green phosphor is converted into green light having a peak in the vicinity of 530 nm. Among light incident upon the second filter layer of the second wavelength control film 11 through the green phosphor layer, light having a wavelength of 480 nm to 500 nm is reflected, and the remaining light passes therethrough as it is. The reflected light having a wavelength of 480 nm to 500 nm is reflected by the reflective plate 5 and the light guide body 4 and is brought to be incident upon the second wavelength control film 11 again. Among the incident light having a wavelength of 480 nm to 500 nm, light striking the green phosphor is converted into green light and passes through the second filter layer, and the light that does not strike the green phosphor is reflected by the second filter layer again. Thus, the reflection and wavelength conversion are repeated a number of times, whereby most of the light having a wavelength of 480 nm to 500 nm is converted into green light having a peak in a wavelength of 530 nm finally. Here, light having a wavelength of 480 nm to 500 nm is unnecessary, and green light (about 530 nm) is emphasized using the unnecessary light.

Next, the light having passed through the second wavelength control film 11 is brought to be incident upon the first wavelength control film 1. The first wavelength control film 1 may also have basically the same cross-sectional configuration as that of the wavelength control film shown in FIG. 1. In the first wavelength control film 1 of this embodiment, the phosphor dispersed in the phosphor layer is a red phosphor that is excited with blue to green light having a wavelength of 400 nm to 590 nm to emit red light. As the red phosphor, SrS, CaS, or CaAlSiN$_3$ with Eu added thereto as a rare-earth element, or silicate of 3,1,5 composition system may be illustrated. Alternatively, a transparent base film coated with a red phosphor may be used. FIG. 6 shows transmittance characteristics of the first filter layer placed on an observer side of the red phosphor layer. As shown in FIG. 6, the first filter layer of this embodiment is configured so as to reflect light having a wavelength of 570 nm to 590 nm. Thus, among light having a wavelength region of 570 nm to 590 nm reflected by the first filter layer, light striking the red phosphor is converted into red light and passes through the first filter layer. Light that does not strike the red phosphor is reflected by the first filter layer again. More specifically, in the same way as in the case of the second wavelength control film 11, due to the repetition of the reflection and color conversion, components having a wavelength of 570 nm to 590 nm are hardly present in light output from the first wavelength control film 1 finally. Here, light having a wavelength of 570 nm to 590 nm is unnecessary, and necessary red light may be emphasized using the unnecessary light.

Further, the output efficiency of light is increased in most cases by providing a diffusion layer on the filter layer.

Figure 7:
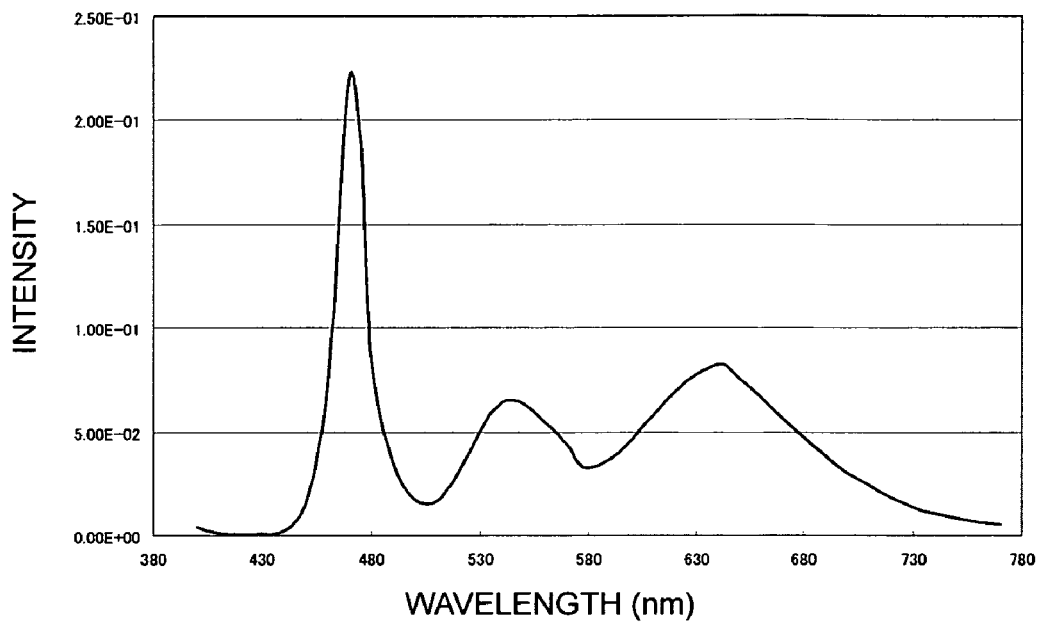
FIG. 7 is a diagram showing a relationship between a wavelength and an intensity of a three-wavelength LED used in an embodiment.
Figure 8:
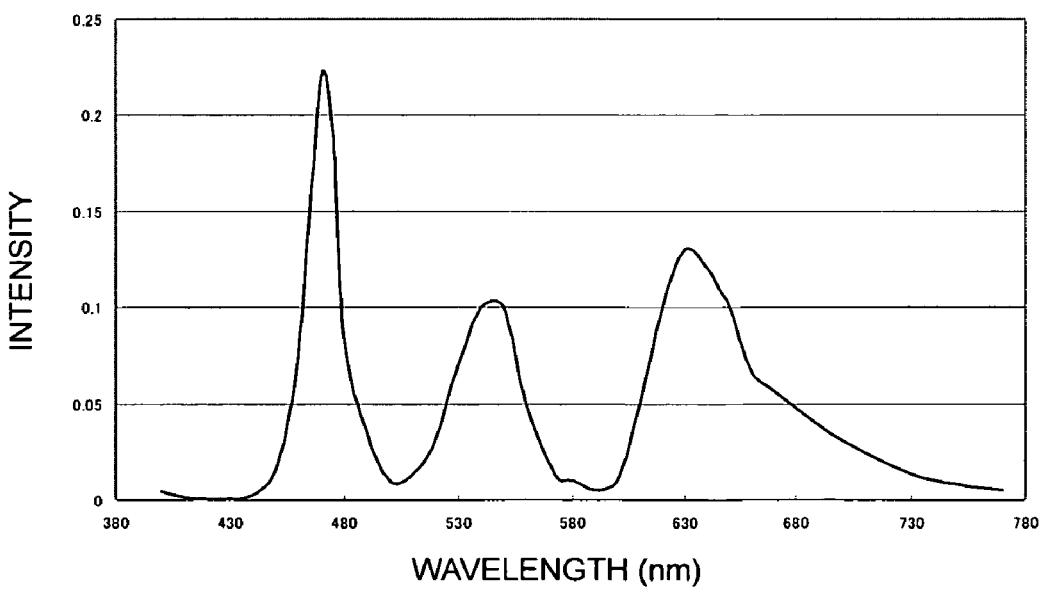
FIG. 8 is a diagram showing wavelength-intensity characteristics of an illuminating device according to the present invention.

FIG. 7 shows spectral characteristics of the light source 3 of a three-wavelength light-emitting type having a configuration in which a resin mixed with a green phosphor and a red phosphor is potted to a blue LED. Light having such spectral characteristics passes through the second wavelength control film 11 and the first wavelength control film 1, thereby being converted into light having spectral characteristics as shown in FIG. 8. More specifically, most of the light having a wavelength of 480 nm to 500 nm and a wavelength of 570 nm to 590 nm is eliminated by two kinds of filter layers. It is understood that a green component having a wavelength of 530 nm and a red component having a wavelength of 630 nm are increased instead by two kinds of phosphor layers.

Generally, the arrangement of the first wavelength control film 1 and the second wavelength control film 11 may be replaced. It should be noted that the red phosphor contained in the first wavelength control film 1 illustrated as a specific example is excited with light having a wavelength of 400 nm to 590 nm to emit red light. More specifically, since light having a wavelength of 570 nm to 590 nm reflected by the second filter layer of the second wavelength control film 11 is also converted into red light, if the arrangement is replaced, light having a wavelength of 570 nm to 590 nm that passes through the first wavelength control film 1 and is brought to be incident upon the second wavelength control film 11 decreases, and a green component may not be increased sufficiently as a result. Thus, in the case where it is desired to increase a green component sufficiently, the arrangement shown in FIG. 2 is more preferred.

Next, FIG. 9 shows characteristics of a color filter of the display element 2 used in this embodiment. The display element 2 includes a color filter of three colors: blue, green, and red. FIG. 9 shows blue color filter characteristics 12, green color filter characteristics 13, and red color filter characteristics 14. As is apparent from the figure, light having a wavelength of 480 nm to 500 nm and a wavelength of 570 nm to 590 nm is contained in absorption regions (cut regions) 15 and 16 by the color filter and is mostly cut even if it reaches the display element. That is, it is understood that, by using the first and second wavelength control films as in this embodiment, light originally having a wavelength in the cut region may be converted into light having an effective wavelength.

Further, as one arrangement of the configuration shown in FIG. 2, the following display device is also conceivable. More specifically, as shown in FIG. 2, in the display device, a first wavelength control film 1 having a filter layer that selectively reflects light in a particular wavelength region and a phosphor layer that is excited with light reflected by the filter layer to emit light, and a second wavelength control film 11 having a second filter layer that reflects a light component in a second particular wavelength region different from the particular wavelength region and a second phosphor layer that is excited with light reflected by the second filter layer to emit light are provided between the light source radiating light from a light-emitting portion and the display element 2, and the light emitted by the second phosphor layer passes through at least one of the filter layer and the second filter layer. For example, as shown in FIG. 2, in the case where the second filter layer is placed between the first filter layer and the light-emitting portion, the second phosphor layer may emit light in a wavelength region reflected by the filter layer of the first wavelength control film 1. At this time, although the light emitted by the second phosphor layer does not pass through the filter layer of the first wavelength control film as it is, the light is converted by the phosphor layer of the first wavelength control film, and hence the light can contribute to the light emission of the phosphor layer of the first wavelength control film. Needless to say, it is preferred that the second phosphor layer emit light passing through the second filter layer and the filter layer of the first wavelength control film 1 in terms of a light efficiency. Further, the phosphor layer and the second phosphor layer may emit light in colors in different wavelength regions, or may emit light in a color in the same wavelength region. Even in the case where the phosphor layer and the second phosphor layer emit light in a color in the same wavelength region, the phosphor layer and the second phosphor layer may use the same phosphor or different phosphors.

Figure 3:
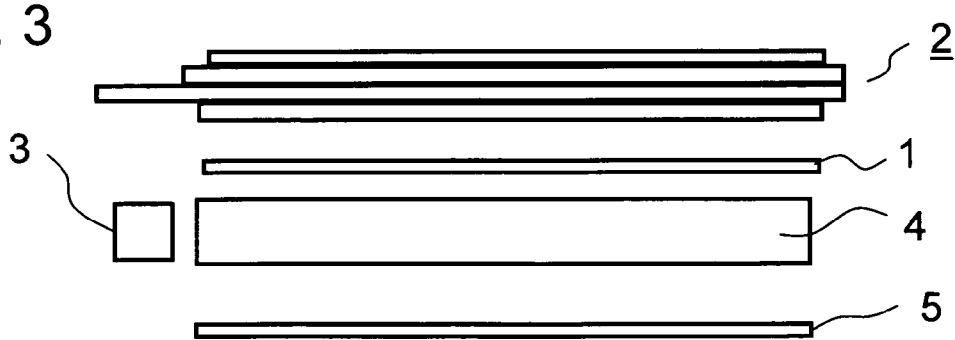
FIG. 3 is a schematic view showing another configuration of a cross-section of the display device including a wavelength control film according to the present invention.
Figure 4:
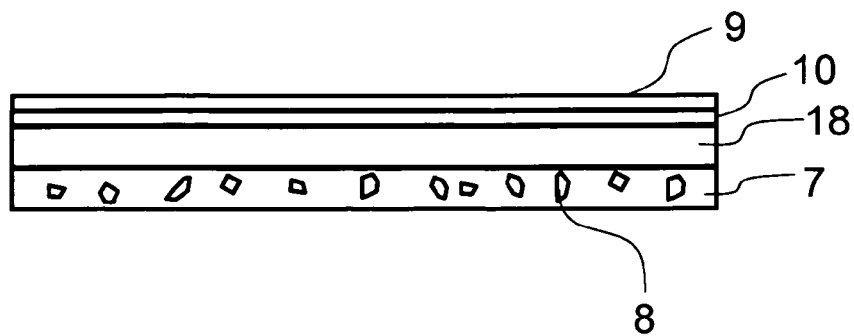
FIG. 4 is a schematic view showing an example of a configuration of a cross-section of the wavelength control film shown in FIG. 3.

As described above, the configuration using two kinds of wavelength control films has been described using FIG. 2. Hereinafter, the configuration using one wavelength control film is described with reference to FIGS. 3 and 4. FIG. 3 is a cross-sectional view schematically showing a configuration using one wavelength control film, which is different from the configuration of FIG. 2 in the number of wavelength control films and the detail thereof. Here, the description of portions overlapping those of the configuration shown in FIG. 2 is omitted appropriately. FIG. 4 schematically shows a cross-sectional configuration of the wavelength control film used therein. The phosphor layer 7 in which the phosphor 8 is dispersed in a transparent resin or the like is provided on the base film 18. In the phosphor layer 7, a red phosphor converting light reflected by the filter layer into red light is dispersed. The second filter layer 10 and the first filter layer 9 are laminated on an observer side of the phosphor layer 7. The second filter layer 10 reflects light having a wavelength of 480 nm to 500 nm, and the first filter layer 9 reflects light having a wavelength of 570 nm to 590 nm. The wavelength control film with such a configuration not only cuts light having an unnecessary wavelength (light having a wavelength of 480 nm to 500 nm and a wavelength of 570 nm to 590 nm), but also increases light of a red component. Needless to say, the use of phosphors in other colors in the phosphor layer 7 can increase components in other colors. Further, if the red phosphor and the green phosphor are used, the effect that is substantially the same as that in the configuration shown in FIG. 2 may be obtained.

Embodiment 3

In this embodiment, the detail of the wavelength control film used in Embodiment 2 is described. FIG. 1 schematically shows a cross-sectional configuration of the wavelength control film of this embodiment. As shown in FIG. 1, the phosphor layer 7 containing the phosphor 8, and the filter layer 6 reflecting light having a particular wavelength are provided on the base film 18. The phosphor layer 7 has a configuration in which the phosphor 8 is dispersed in a transparent resin or the like. The phosphor 8 emits light having a wavelength different from an excitation wavelength, with the wavelength of light reflected by the filter layer 6 being the excitation wavelength. By using the wavelength control film with such a configuration, a light component having a particular wavelength (light reflected by the filter layer) may be decreased, and a light component having another particular wavelength (light emitted by the phosphor) may be increased. At this time, at least a part of a wavelength region of light reflected by the filter layer needs to be the excitation wavelength of the phosphor, because a light component desired to be decreased is to be converted into a light component desired to be increased. Further, by providing a diffusion layer on the filter layer 6, the output efficiency of light increases in most cases.

The configuration of emphasizing a red component using such a wavelength control film is illustrated. The phosphor layer 7 of the wavelength control film and a light source such as a fluorescent tube are placed so that they face each other, and a reflection mechanism is placed so that the light source is interposed between the phosphor layer 7 of the wavelength control film and the reflection mechanism. The reflection mechanism may be a reflective sheet with silver or aluminum vapor-deposited thereon, or a metal plate such as a high-reflective aluminum plate. The filter layer 6 is provided with characteristics of reflecting only light having a wavelength of 510 nm to 540 nm, and the phosphor layer 7 is provided with characteristics of emitting a red component having a wavelength of about 600 nm. For example, as the phosphor layer 7, a silicate-based red phosphor material of a 3,1,5 composition system is applied. The phosphor material is excited with light having a wavelength of 510 nm to 540 nm efficiently, and emits red light having a wavelength of about 600 nm. The function of such a configuration is described. Among light that is brought to be incident upon the phosphor layer 7 from the light source, light having an excitation wavelength (510 nm to 540 nm), which strikes a phosphor, is converted into red light and passes through the filter layer. Then, the light having an excitation wavelength, which does not strike the phosphor, is reflected by the filter layer 6 and is brought to be incident upon the phosphor layer 7 again. At this time, light having an excitation wavelength, which strikes the phosphor, is converted into a red component having a wavelength of about 600 nm, and hence, passes through the filter layer 6. On the other hand, the light having an excitation wavelength, which does not strike the phosphor at this time, enters the phosphor layer 7 and the filter layer 6 due to the reflection mechanism again. Thus, due to the repetition of the reflection and color conversion, most of the light having an excitation wavelength is converted into red light and passes through the filter layer 6 finally. More specifically, only light having an unnecessary wavelength (510 nm to 540 nm) is cut, and light having a necessary wavelength (about 600 nm) may be emphasized.

For example, in the case where a light source is only a fluorescent tube, a red component is inconspicuous due to a green component having a wavelength of 510 nm to 540 nm. However, the use of the wavelength control film as in this embodiment can make the red component conspicuous by eliminating the green component. Further, this is not merely color absorption by a filter, and hence an illuminating device having a very high use efficiency of light may be provided.

Here, as the base film 18, a transparent resin such as PET, PES, or acryl, or a transparent glass plate may be used. As the filter layer 6, a multi-layered film in which tens of thin films having different refractive indexes of $SiO_2$, $TiO_2$, or the like are laminated alternately, or a nanoparticle layer of about 200 to 300 m may be used.

As described above, according to the present invention, only light having an unnecessary wavelength may be cut and light having a necessary wavelength may be emphasized easily at low power consumption and a low cost. More specifically, by using a phosphor that converts light in a wavelength region that has not been used conventionally (for example, light absorbed by a color filter) into light in an available wavelength region (for example, light passing through a color filter), an illuminating device capable of controlling a color tone easily and a bright display device may be realized.

What is claimed is:

1. A display device comprising:
   a light source that radiates light from a light-emitting portion;
   a light guide body that receives an incident light from the light-emitting portion of the light source and that emits light;
   a display element that is illuminated by light emitted from the light guide body, the display element having a color filter having a coloring layer of RGB;
   a filter layer that reflects components of light having a wavelength in a preselected region of 570 nm to 590 nm from among components of the light radiated from the light source and emitted from the light guide body; and
   a phosphor that is excited by the components of light in the preselected region reflected by the filter layer and that emits red light that passes through the filter layer and through the color filter of the display element.

2. A display device according to claim 1; further comprising a phosphor layer containing the phosphor and a base film on which the phosphor layer and the filter layer are formed.

3. A display device according to claim 1; wherein the light source is disposed between the phosphor and the filter layer.

4. A display device according to claim 1; wherein the light guide body has an incident surface that receives the incident light from the light-emitting portion of the light source and an emission surface that emits the light from the light guide body; and wherein the filter layer is disposed between the light source and the incident surface of the light guide body.

5. A display device according to claim 4; wherein the light source comprises a point light source; and wherein the filter layer is disposed over an entire surface of the incident surface of the light guide body.

6. A display device according to claim 1; wherein the filter layer is formed on opposite surfaces of a base film.

7. A display device according to claim 1; wherein the filter layer is disposed between the light guide body and the display element.

8. A display device according to claim 1; wherein the filter layer comprises a first filter layer; and further comprising a second filter layer that reflects components of light having a wavelength in a preselected region of 480 nm to 500 nm from among components of the light radiated from the light source and emitted from the light guide body.

9. A display device according to claim 8; wherein the first filter layer is disposed between the light-emitting portion of the light source and the display element, and the second filter layer is disposed between the light-emitting portion of the light source and the first filter layer; and wherein the phosphor is excited by the components of light in both the preselected region of 570 nm to 590 nm reflected by the first filter layer and the preselected region of 480 nm to 500 nm reflected by the second filter layer to emit light that passes through the first and second filter layers.

10. A display device according to claim 8; wherein the phosphor comprises a first phosphor; and further comprising a second phosphor that is excited with the components of light reflected by the second filter layer to emit green light that passes through at least one of the first and second filter layers, the second phosphor being disposed between the second filter layer and the light-emitting portion of the light source.

11. A display device according to claim 8; wherein at least one of the first filter layer and the second filter layer comprises a base film and a plurality of nanoparticles of about 200 nm to 300 nm laminated on the base film.

12. A display device comprising:
a light source;
a light guide that receives light from the light source and that emits the light from an emission surface, the light including light components having a wavelength in at least one region of 480 nm to 500 nm and 570 nm to 590 nm;
a display element provided on an emission surface side of the light guide, the display element having a red filter, a green filter and a blue filter;
a filter layer that reflects components of light having a wavelength in the at least one region of 480 nm to 510 nm and 570 nm to 590 nm; and
a phosphor that is excited by the components of light having a wavelength in the at least one region of 480 nm to 510 nm and 570 nm to 590 nm and reflected by the filter layer and that emits light of a wavelength that passes through the filter layer and through at least one of the red filter, the green filter and the blue filter of the display element.

13. A display device according to claim 12; further comprising a phosphor layer containing the phosphor and a base film on which the phosphor layer and the filter layer are formed.

14. A display device according to claim 12; wherein the light source is disposed between the phosphor and the filter layer.

15. A display device according to claim 12; wherein the light guide body has an incident surface that receives the light from the light source; and wherein the filter layer is disposed between the light source and the incident surface of the light guide body.

16. A display device according to claim 15; wherein the light source comprises a point light source; and wherein the filter layer is disposed over an entire surface of the incident surface of the light guide body.

17. A display device according to claim 12; wherein the filter layer is formed on opposite surfaces of a base film.

18. A display device according to claim 12; wherein the filter layer is disposed between the light guide body and the display element.

19. A display device according to claim 12; wherein the filter layer comprises a first filter layer that reflects components of light having a wavelength in the at least one region of 480 nm to 510 nm and a second filter layer that reflects components of light having a wavelength in the at least one region of 570 nm to 590 nm.

20. A display device according to claim 19; wherein the first filter layer is disposed between the light source and the display element, and the second filter layer is disposed between the light source and the first filter layer.

* * * * *